United States Patent
Lee et al.

(10) Patent No.: US 9,735,745 B2
(45) Date of Patent: Aug. 15, 2017

(54) POWER AMPLIFIER AND METHOD FOR LIMITING CURRENT IN POWER AMPLIFIER

(71) Applicant: Samsung Electro-Mechanics Co., Ltd., Suwon-si (KR)

(72) Inventors: Kwang Du Lee, Suwon-si (KR); Ho Kwon Yoon, Suwon-si (KR); Jong Ok Ha, Suwon-si (KR); Kyung Hee Hong, Suwon-si (KR); Shinichi Iizuka, Suwon-si (KR); Jae Hyouck Choi, Suwon-si (KR); Suk Chan Kang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/071,599

(22) Filed: Mar. 16, 2016

(65) Prior Publication Data

US 2016/0322940 A1    Nov. 3, 2016

(30) Foreign Application Priority Data

Apr. 30, 2015  (KR) .................. 10-2015-0061419

(51) Int. Cl.
*H03F 3/19*   (2006.01)
*H03F 1/52*   (2006.01)
*H03F 3/21*   (2006.01)
*H03F 1/02*   (2006.01)

(52) U.S. Cl.
CPC ............ *H03F 3/19* (2013.01); *H03F 1/0272* (2013.01); *H03F 1/52* (2013.01); *H03F 3/21* (2013.01); *H03F 2200/18* (2013.01); *H03F 2200/411* (2013.01); *H03F 2200/444* (2013.01); *H03F 2200/451* (2013.01); *H03F 2200/462* (2013.01)

(58) Field of Classification Search
CPC ................. H03F 3/19; H03F 1/02; H03F 1/52
USPC ....................... 330/295, 296, 124 R
See application file for complete search history.

(56) References Cited

U.S. PATENT DOCUMENTS

| | | | |
|---|---|---|---|
| 5,220,290 A  * | 6/1993 | Black ................... | H03G 3/3047 330/133 |
| 6,218,904 B1 * | 4/2001 | Panther ................. | H03F 1/0283 330/296 |
| 2004/0108902 A1* | 6/2004 | Akamine .............. | H03F 1/0272 330/285 |
| 2005/0030106 A1 | 2/2005 | Yamamoto et al. | |

(Continued)

FOREIGN PATENT DOCUMENTS

| JP | 2005-64658 A | 3/2005 |
|---|---|---|
| JP | 2009-55096 A | 3/2009 |

OTHER PUBLICATIONS

G. De la Rosa, et al., "A GSM-EDGE Power Amplifier with a BiFET Current Limiting Bias Circuit," *IEEE Radio Frequency Integrated Circuits Symposium*, 2009, pp. 595-598.

*Primary Examiner* — Patricia T Nguyen
(74) *Attorney, Agent, or Firm* — NSIP Law

(57) ABSTRACT

A power amplifier apparatus includes: an amplifier configured to amplify an input signal; a sensing circuit connected to the amplifier and configured to sense a bias of the amplifier; and a biasing circuit connected to the sensing circuit and configured to provide a biasing current to the amplifier, wherein the sensing circuit is configured to change the biasing current based on the bias of the amplifier.

18 Claims, 11 Drawing Sheets

(56) References Cited

U.S. PATENT DOCUMENTS

| | | | |
|---|---|---|---|
| 2005/0083129 A1* | 4/2005 | Tsurumaki | H03F 1/301 330/285 |
| 2006/0087375 A1* | 4/2006 | Hong | H03G 3/004 330/285 |
| 2007/0066250 A1* | 3/2007 | Takahashi | H03G 3/3047 455/127.1 |
| 2009/0051437 A1 | 2/2009 | Yamamoto et al. | |
| 2015/0070092 A1* | 3/2015 | Ishimoto | H03F 3/195 330/291 |

* cited by examiner

POWER AMPLIFIER AND METHOD FOR LIMITING CURRENT IN POWER AMPLIFIER

CROSS-REFERENCE TO RELATED APPLICATION(S)

This application claims the benefit under 35 USC 119(a) of Korean Patent Application No. 10-2015-0061419 filed on Apr. 30, 2015 in the Korean Intellectual Property Office, the entire disclosure of which is incorporated herein by reference for all purposes.

BACKGROUND

1. Field

The following description relates to a power amplifier and a method for limiting a current in a power amplifier.

2. Description of Related Art

In general, a power amplifier (PA) amplifying a high signal consumes a large amount of current. Further, in order to output a high signal having a level of a few watts (W), output impedance of the power amplifier needs to be decreased.

However, in a case in which the output impedance of the power amplifier is low, the output impedance may be significantly changed even if an operating environment is only changed slightly. As the change of the output impedance is high, a frequency at which an over-current (e.g., current in excess of an intended amount) flows in the power amplifier may be increased.

Since the over-current generated by the power amplifier may damage elements included in the power amplifier, a means for breaking the over-current so that the over-current of an allowable value or more does not flow in the power amplifier is desirable.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a power amplifier apparatus includes: an amplifier configured to amplify an input signal; a sensing circuit connected to the amplifier and configured to sense a bias of the amplifier; and a biasing circuit connected to the sensing circuit and configured to provide a biasing current to the amplifier, wherein the sensing circuit is configured to change the biasing current based on the bias of the amplifier.

The amplifier may include: a first amplifying circuit configured to amplify the input signal; and a second amplifying circuit configured to amplify the input signal amplified by the first amplifying circuit. The sensing circuit may be connected to the second amplifying circuit.

The amplifier may include at least one bipolar junction transistor (BJT) configured to amplify a signal input to a base terminal and output the amplified signal to a collector terminal. The sensing circuit may be configured to sense a bias current of the base terminal of the bipolar junction transistor.

The sensing circuit may include: a diode configured to pass a current based on the bias of the amplifier; a first resistor connected between the amplifier and the diode; and a second resistor connected between the diode and the biasing circuit.

As a value of a bias current of the amplifier increases, the sensing circuit may decrease a value of the biasing current.

The biasing circuit may include at least one source circuit configured to generate a reference current and provide the generated reference current to the sensing circuit and a ground. As a bias current of the amplifier increases, a value obtained by dividing the reference current by a current provided to the sensing circuit may decrease.

The source circuit may include a first source circuit configured to generate a first reference current, and a second source circuit configured to generate a second reference current. As a value of a bias current sensed by the sensing circuit increases, a value of a current flowing into the ground from the first source circuit may increase. As the value of the current flowing into the ground from the first source circuit increases, a value of a current flowing into the ground from the second source circuit may increase.

The biasing circuit may further include a first semiconductor switch connected between the first source circuit and the ground, the first semiconductor switch being configured to receive the current flowing into the ground from the first source circuit at a first base terminal, and output the current flowing into the ground to a first emitter terminal, and a second semiconductor switch connected between the second source circuit and the ground, the second semiconductor switch being configured to receive the current flowing into the ground from the second source circuit at a second collector terminal, and output the current flowing into the ground to a second emitter terminal. A value of the current flowing in a second base terminal of the second semiconductor switch may be determined based on a value of current flowing in a first collector terminal of the first semiconductor switch.

According to another general aspect, a power amplifier includes: a first amplifier configured to amplify an input signal; a second amplifier connected to the first amplifier and configured to amplify the input signal amplified by the first amplifier; a sensing circuit connected to the second amplifier and configured to sense a bias of the second amplifier; and a biasing circuit connected to the sensing circuit and the first amplifier and configured to provide a biasing current to the first amplifier, wherein the sensing circuit is configured to change the biasing current based on the bias of the second amplifier.

The second amplifier may include at least one bipolar junction transistor (BJT) configured to amplify a signal input to a base terminal and output the amplified signal to a collector terminal. The sensing circuit may be configured to sense a bias current of the base terminal of the bipolar junction transistor. As a value of a bias current of the second amplifier increases, the biasing circuit may decrease a value of the biasing current provided to the first amplifier.

The sensing circuit may include: a diode configured to pass a current based on the bias of the second amplifier; a first resistor connected between the second amplifier and the diode; and a second resistor connected between the diode and the biasing circuit.

The biasing circuit may include a first source circuit configured to generate a first reference current and provide the reference current to the sensing circuit and a ground, and a second source circuit configured to generate a second reference current and provide the second reference current to the first amplifier and the ground. As a value of a bias current sensed by the sensing circuit increases, a value of a current flowing into the ground from the first source circuit may increase. As the value of the current flowing into the ground from the first source circuit increases, a value of a current flowing into the ground from the second source circuit may increase.

The biasing circuit may further include a first semiconductor switch connected between the first source circuit and the ground, the first semiconductor switch being configured to receive the current flowing into the ground from the first source circuit at a first base terminal and output the current flowing into the ground to a first emitter terminal, and a second semiconductor switch connected between the second source circuit and the ground, the second semiconductor switch being configured to receive the current flowing into the ground from the second source circuit at a second collector terminal and output the current flowing into the ground to a second emitter terminal. A value of a current flowing in a second base terminal of the second semiconductor switch may be determined based on a value of a current flowing in a first collector terminal of the first semiconductor switch.

According to another general aspect, a method for limiting current in a power amplifier apparatus includes: providing a biasing current to an amplifier; sensing, at a sensing circuit connected to the amplifier, a bias of the amplifier; and changing the biasing current based on the bias of the amplifier, using the sensing circuit.

The sensing circuit may include: a diode configured to pass a current based on the bias of the amplifier; a first resistor connected between the amplifier and the diode; and a second resistor connected between the diode and a biasing circuit providing the biasing current to the amplifier.

The method may further include decreasing a value of the biasing current in response to a value of a bias current of the amplifier increasing.

The method may further include: providing the biasing current to the amplifier by providing, using a biasing circuit, a reference current to the sensing circuit and a ground; and as a bias current of the amplifier increases, adjusting a current provided to the sensing circuit such that a value obtained by dividing the reference current by the current provided to the sensing circuit decreases.

The method may further include, as a value of a bias current sensed by the sensing circuit increases, increasing an amount of current flowing into the ground from the biasing circuit.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
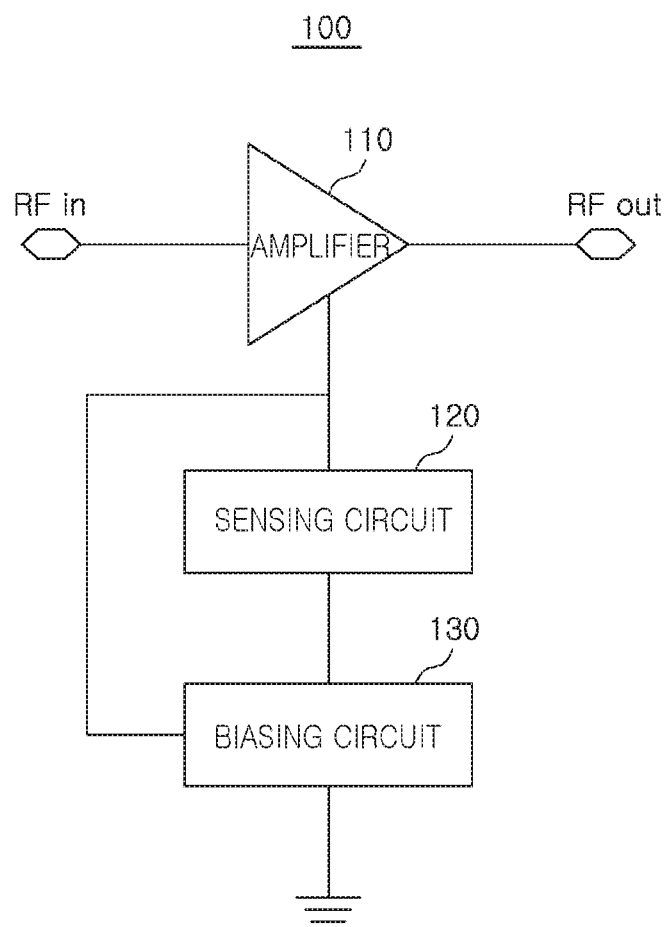
FIG. 1 is a conceptual view illustrating a power amplifier, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

FIG. 1 is a conceptual view illustrating a power amplifier 100, according to an embodiment. Referring to FIG. 1, the power amplifier 100 includes an amplifier 110, a sensing circuit 120, and a biasing circuit 130.

The amplifier 110 amplifies an input signal. The input signal is input through an input terminal RF in. The signal amplified by the amplifier 110 is output through an output terminal RF out. For example, the output terminal RF out may be connected to an antenna (not illustrated).

The sensing circuit 120 is connected to the amplifier 110 to sense a bias of the amplifier 110. For example, the sensing circuit 120 includes semiconductor elements such as a diode, a transistor, and the like, of which a flowing current changes depending on a bias current or a bias voltage of the amplifier 110.

Further, the sensing circuit 120 changes a value of a current provided to the amplifier 110 by the biasing circuit 130 based on the bias of the amplifier 110. For example, as a value of the bias current of the amplifier 110 increases, the sensing circuit 120 decreases the value of the current provided to the amplifier 110 by the biasing circuit 130.

The biasing circuit 130 is connected to the sensing circuit 120 and provides the current to the amplifier 110 to bias the amplifier 110. Here, biasing means that a current or voltage of a specific value is provided so that a bias current flows in a specific block or element, or a bias voltage is applied to the specific block or element.

The current or the voltage provided to the amplifier 110 by the biasing circuit 130 changes depending on the bias sensed by the sensing circuit 120. For example, in a case in which the current provided to the amplifier 110 by the biasing circuit 130 decreases, a current flowing into a ground from the biasing circuit 130 increases. That is, a current or voltage distribution of the biasing circuit 130 changes depending on a state of the sensing circuit 120.

As a result, the power amplifier 100 may break an over-current (e.g., current in excess of an intended amount) of an allowable value or more so as not to flow the over-current in the power amplifier, thereby reducing possibility of damage to elements.

Figure 2:
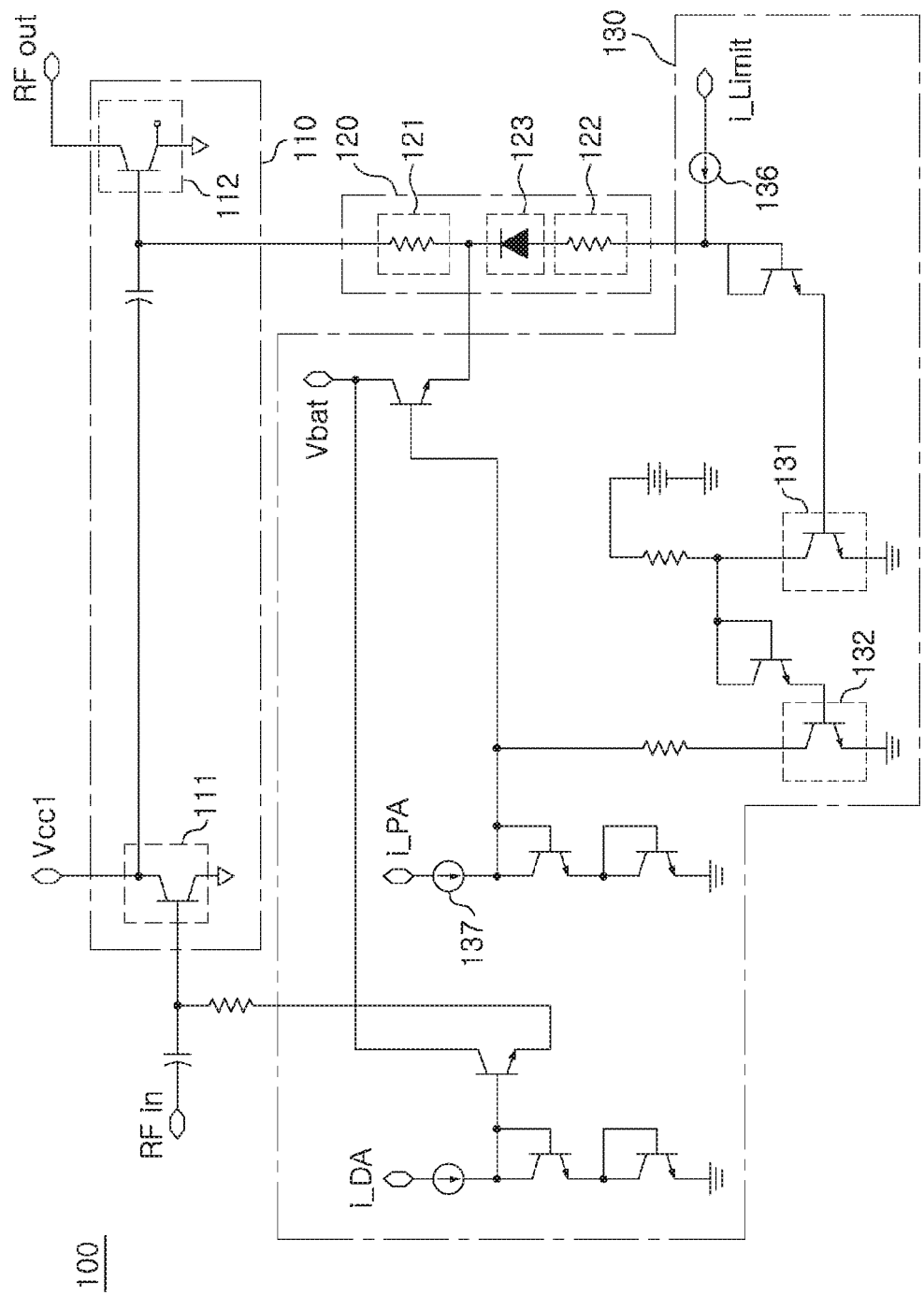
FIG. 2 is a circuit diagram illustrating the power amplifier of FIG. 1, according to an embodiment.

FIG. 2 is a circuit diagram illustrating the power amplifier 100 of FIG. 1, according to an embodiment. Referring to FIG. 2, the amplifier 110 includes a first amplifying circuit 111 and a second amplifying circuit 112. The first amplifying circuit 111 amplifies the input signal. For example, the first amplifying circuit 111 is a driving amplifier DA amplifying a low signal to have an amplitude within an amplification range of the second amplifying circuit 112.

The second amplifying circuit 112 amplifies the signal amplified by the first amplifying circuit 111. For example, since the signal amplified by the second amplifying circuit 112 is a high signal having a level of a few watts (W), an over-current may flow in the second amplifying circuit 112. The power amplifier 100 reduces a frequency at which the over-current flows in the second amplifying circuit 112.

For example, the second amplifying circuit 112 includes at least one bipolar junction transistor (BJT) amplifying a signal input to a base terminal and outputting the amplified signal to a collector terminal. Here, a current flowing in the base terminal of the bipolar junction transistor and a current flowing in the collector terminal of the bipolar junction transistor have a proportional relationship. Thus, the sensing circuit 120 senses a bias current of the base terminal of the bipolar junction transistor, thereby sensing an over-current flowing in the collector terminal of the second amplifying circuit 112.

Referring to FIG. 2, the sensing circuit 120 includes a first resistor 121, a second resistor 122, and a diode 123. The first resistor 121 is connected between the second amplifying circuit 112 and the diode 123. For example, the current flowing in the base terminal of the second amplifying circuit 112 also flows in the second resistor 122. A voltage corresponding to a product of a resistance value of the first resistor 121 and a current flowing in the first resistor 121 is applied across the first resistor 121.

The second resistor 122 is connected between the diode 123 and the biasing circuit 130. A voltage corresponding to a product of a resistance value of the second resistor 122 and a current flowing in the second resistor 122 is applied across the second resistor 122.

A current based on the bias of the amplifier 110 flows in the diode 123. For example, in a case in which a voltage across the diode 123 is lower than a threshold voltage, the current flowing in the diode 123 is low. For example, in a case in which the voltage across the diode 123 is higher than the threshold voltage, the current flowing in the diode 123 increases as a voltage across a plurality of terminals increases. That is, the current flowing in the diode 123 is determined based on a direct current (DC) voltage determined by currents flowing in the first resistor 121, the second resistor 122, and the sensing circuit 120.

The diode 123 may be implemented as a transistor of which a base terminal and a collector terminal are connected to each other, and may also be implemented as a field effect transistor of which a gate terminal and a drain terminal are connected to each other. Thus, the diode 123 is not limited to a diode element formed by a single p-n junction.

A value of the current flowing in the sensing circuit 120 is adjusted depending on the resistance value of the first resistor 121 or the second resistor 122. A detailed description the adjustment of the value of the current flowing in the sensing circuit 120 will be provided below with reference to FIG. 9.

Referring to FIG. 2, the biasing circuit 130 includes a first semiconductor switch 131, a second semiconductor switch 132, a first source circuit 136, and a second source circuit 137. The first semiconductor switch 131 is connected between the first source circuit 136 and a ground, and receives a current flowing into the ground from the first source circuit 136 at a base terminal and outputs the received current to an emitter terminal. Here, the source circuit is a current source circuit or a voltage source circuit.

The second semiconductor switch 132 is connected between the second source circuit 137 and the ground, and receives a current flowing into the ground from the second source circuit 137 at a collector terminal and outputs the received current to an emitter terminal.

A value of the current flowing in the base terminal of the second semiconductor switch 132 is determined based on a value of the current flowing in the collector terminal of the first semiconductor switch 131. Specifically, the current flowing in the collector terminal of the first semiconductor switch 131 and the current flowing in the base terminal of the second semiconductor switch 132 have a proportional relationship.

The first source circuit 136 generates a first reference current and provides the first reference current to the sensing circuit 120 and the ground. As a resistance value of the sensing circuit 120 increases, a value of a current flowing into the ground from the first source circuit 136 increases.

The second source circuit 137 generates a second reference current and provides the second reference current to the sensing circuit 120 and the ground. As the value of the current flowing into the ground from the first source circuit 136 increases, the current flowing into the ground from the second source circuit 137 increases.

Specifically, the value of the current flowing into the ground from the first source circuit 136 and a base current of the first semiconductor switch 131 are proportional. The base current of the first semiconductor switch 131 is proportional to a collector current of the first semiconductor switch 131. The collector current of the first semiconductor switch 131 and a base current of the second semiconductor switch 132 are proportional. The base current of the second semiconductor switch 132 and a collector current of the second semiconductor switch 132 are proportional. Thus, as the current flowing into the ground from the first source circuit 136 increases, the current flowing into the ground from the second source circuit 137 increases.

Increasing the current flowing into the ground from the source circuit means that a value obtained by dividing a value of the reference current by a value of the current provided to the sensing circuit 120 decreases. As a result, a current flowing into the amplifier 110 is reduced, and an occurrence frequency of the over-current is reduced.

Figure 3:
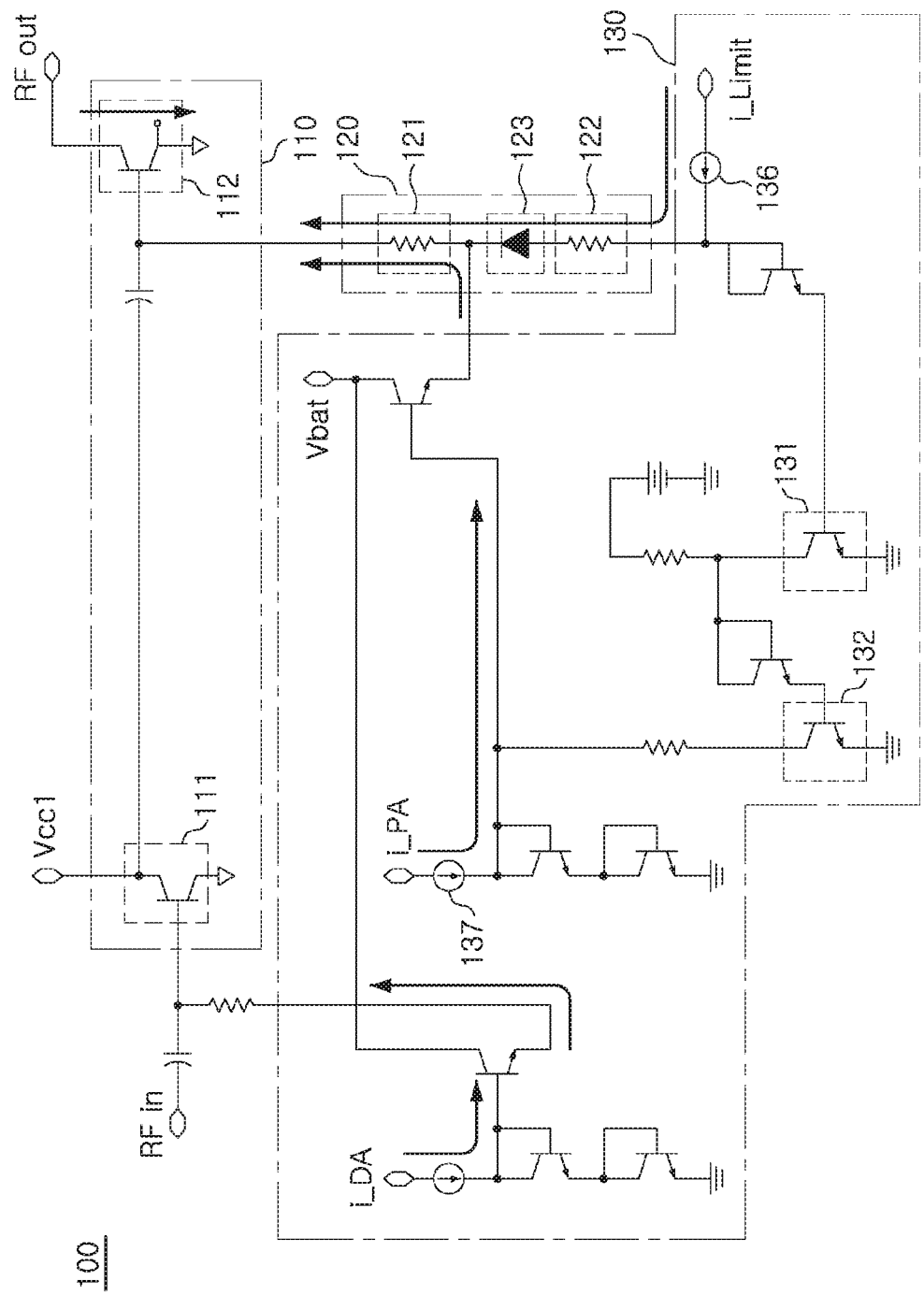
FIG. 3 is a diagram illustrating an operation of the power amplifier of FIG. 2, according to an embodiment.

FIG. 3 is a diagram illustrating an operation of the power amplifier 100 of FIG. 2, according to an embodiment. Referring to FIG. 3, a flow of a current in an overall circuit diagram of the power amplifier 100 in a circumstance in which the over-current does not flow in the amplifier 110 is illustrated. Here, a region in which a current of a relatively high value flows is indicated by an arrow. Hereinafter, a description will be provided on the basis of the arrow.

When the over-current does not flow in the second amplifying circuit 112, a value of a bias current of the second amplifying circuit 112 is relatively small, and a bias voltage of the base terminal of the second amplifying circuit 112 is relatively high. In addition, a voltage dropped by the first resistor 121 and the second resistor 122 is low. In addition, since a voltage across the diode 123 is high, a current flowing in the diode 123 is high. That is, since the current flowing in the sensing circuit 120 is high, the majority of the current generated by the first source circuit 136 flows into the sensing circuit 120. In addition, the value of the current flowing into the first semiconductor switch 131 from the first source circuit 136 is low. In addition, the value of the current flowing into the second semiconductor switch 132 is low. In addition, the majority of the current generated by the second source circuit 137 flows into the sensing circuit 120, not the second semiconductor switch 132. Thus, the majority of the current generated by the first source circuit 136 and the second source circuit 137 flows into the second amplifying circuit 112.

The bias current of the first amplifying circuit 111 may be independent of the bias current of the second amplifying circuit 112. For example, the bias current supplied to the first amplifying circuit 111 may have a constant value.

Figure 4:
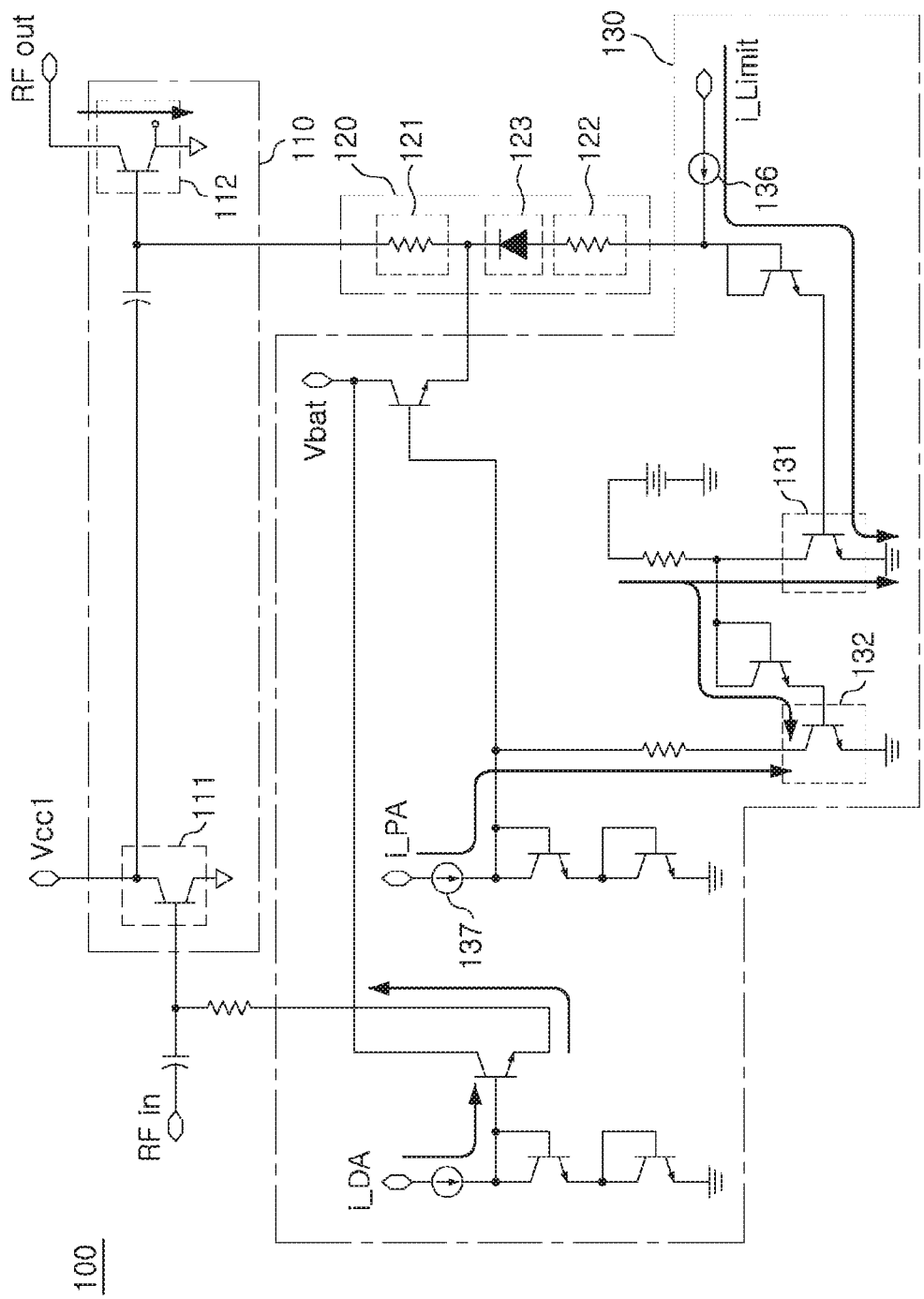
FIG. 4 is a diagram illustrating an operation of limiting a current in the power amplifier of FIG. 2, according to an embodiment.

FIG. 4 is a diagram illustrating an operation of limiting a current in the power amplifier 100 of FIG. 2, according to an embodiment. Referring to FIG. 4, a flow of a current in an overall circuit diagram of the power amplifier is illustrated in a circumstance in which the over-current flows in the amplifier 110. Here, a region in which a current of a relatively high value flows is indicated by an arrow. Hereinafter, a description will be provided on the basis of the arrow.

When the over-current flows in the second amplifying circuit 112, a value of a bias current of the second amplifying circuit 112 is relatively high, and a bias voltage of the base terminal of the second amplifying circuit 112 is relatively low. In addition, a voltage dropped by the first resistor 121 and the second resistor 122 is high. In addition, since a voltage across the diode 123 is low, a current flowing in the diode 123 is low. That is, since the current flowing in the sensing circuit 120 is low, the majority of the current generated by the first source circuit 136 flows into the first semiconductor switch 131, not the sensing circuit 120. In addition, the value of the current flowing into the second semiconductor switch 132 is high. In addition, the majority of the current generated by the second source circuit 137 flows into the second semiconductor switch 132, not the sensing circuit 120.

Thus, the majority of the current generated by the first source circuit 136 and the second source circuit 137 flows into the ground, rather than the second amplifier 112. As a result, since a value of the current supplied to the second amplifying circuit 112 decreases, the second amplifying circuit 112 reaches a current limit.

Figure 5:
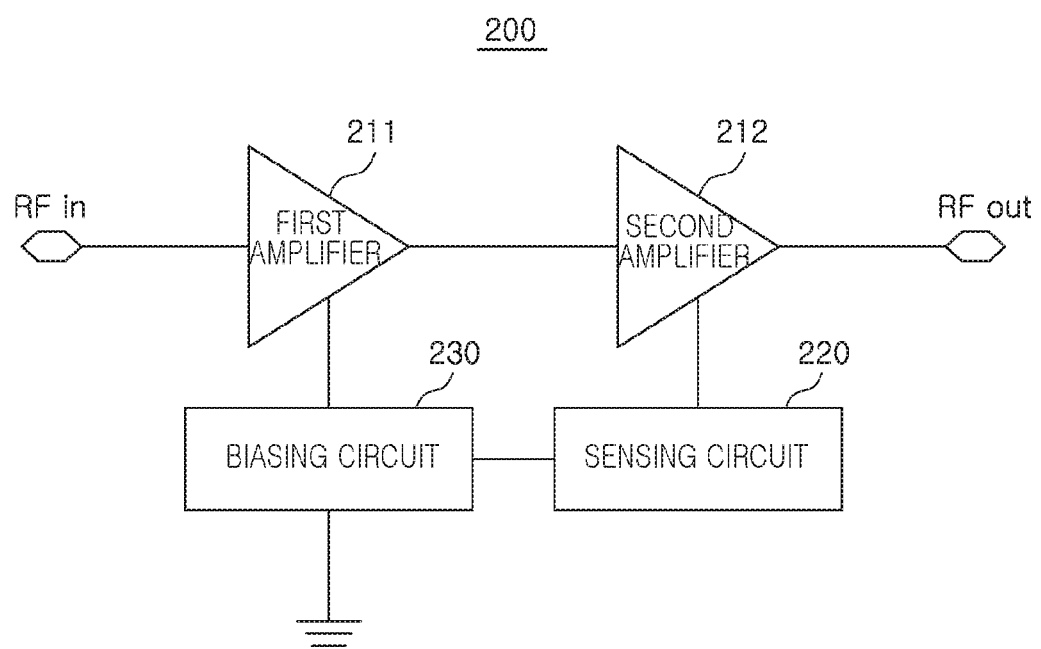
FIG. 5 is a conceptual view illustrating a power amplifier, according to an embodiment.

FIG. 5 is a conceptual view illustrating a power amplifier, according to another embodiment. Referring to FIG. 5, the power amplifier 200 includes a first amplifier 211, a second amplifier 212, a sensing circuit 220, and a biasing circuit 230.

The first amplifier 211 amplifies an input signal. The input signal is input through an input terminal RF in. For example, the first amplifier 211 is a driving amplifier DA amplifying a low signal to have an amplitude within an amplification range of the second amplifier 212.

In a case in which a value of a bias current of the first amplifier 211 decreases, a gain of the first amplifier 211 or energy of an output signal deceases. As a result, energy of a signal input to the second amplifier 212 decreases, and a value of a current flowing in an output terminal of the second amplifier 212 also decreases.

The second amplifier 212 is connected to the first amplifier 211 and amplifies the signal amplified by the first amplifier 211. The signal amplified by the second amplifier 211 is output through an output terminal RF out. For example, since the signal amplified by the second amplifier 212 is a high signal having a level of a few watts (W), an over-current may flow in the second amplifier 212. The power amplifier 200 reduces a frequency at which the over-current flows in the second amplifier 212.

The second amplifier 212 includes at least one bipolar junction transistor (BJT) amplifying a signal input to a base terminal and outputting the amplified signal to a collector terminal. As a result, the sensing circuit 220 senses a bias current of the base terminal of the bipolar junction transistor.

The sensing circuit 220 is connected to the second amplifier 212 to sense a bias of the second amplifier 212. For example, the sensing circuit 220 includes semiconductor elements such as a variable resistor, a diode, a transistor, and the like, of which a resistance value changes depending on a current or a voltage. Specifically, the sensing circuit 220 includes semiconductor elements such as a diode, a transistor, and the like, of which a flowing current changes depending on a bias current or a bias voltage of the second amplifier 212.

The biasing circuit 230 is connected to the sensing circuit 220 and the first amplifier 211, and may provide the current to the first amplifier 211 to bias the first amplifier 211. Here, the biasing means that a current or voltage of a specific value is provided so that a bias current flows in a specific block or element or a bias voltage is applied to the specific block or element.

For example, as a value of the bias current of the second amplifier 212 increases, the biasing circuit 230 decreases the value of the current provided to the first amplifier 211. That is, a current or voltage distribution of the biasing circuit 230 changes depending on a state of the sensing circuit 220.

As a result, the power amplifier 200 breaks an over-current of an allowable value or more so as not to flow the over-current in the power amplifier, thereby reducing the possibility of damage to elements.

Figure 6:
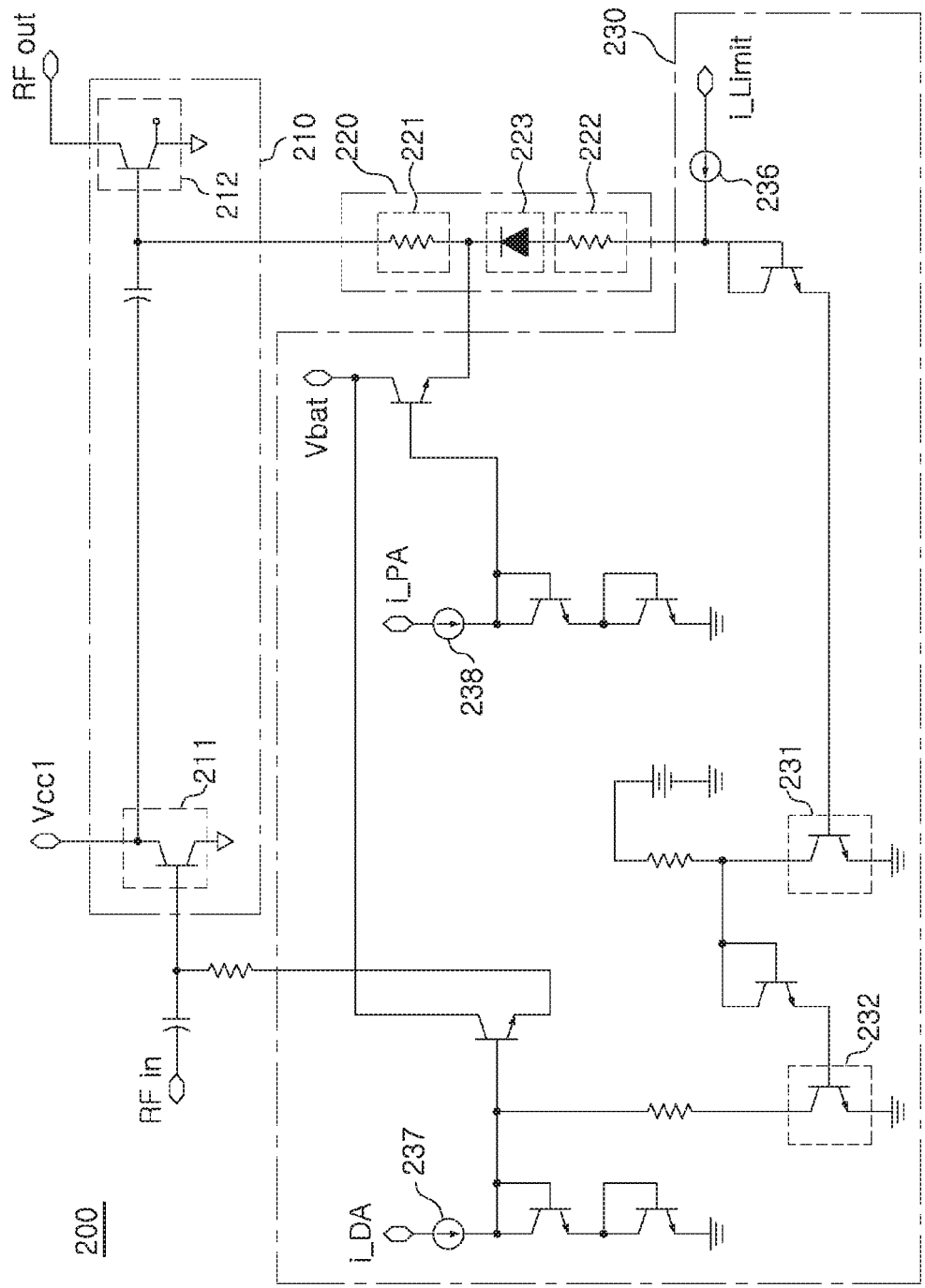
FIG. 6 is a circuit diagram illustrating the power amplifier of FIG. 5, according to an embodiment.

FIG. 6 is a circuit diagram illustrating the power amplifier of FIG. 5, according to an embodiment. Referring to FIG. 6, the sensing circuit 220 includes a first resistor 221, a second resistor 222, and a diode 223.

The first resistor 221 is connected between the second amplifier 212 and the diode 223. For example, the current flowing in the base terminal of the second amplifier 212 also flows in the second resistor 222. A voltage corresponding to a product of a resistance value of the first resistor 221 and a current flowing in the first resistor 221 is applied across the first resistor 221.

The second resistor 222 is connected between the diode 223 and the biasing circuit 230. A voltage corresponding to a product of a resistance value of the second resistor 222 and a current flowing in the second resistor 222 is applied across the second resistor 222.

A current based on the bias of the second amplifier 212 flows in the diode 223. For example, in a case in which a voltage across the diode 223 is lower than a threshold voltage, the current flowing in the diode 223 is low. For example, in a case in which the voltage across the diode 223 is higher than the threshold voltage, the current flowing in the diode 223 increases as a voltage across a plurality of terminals increases. That is, the current flowing in the diode 223 changes based on a direct current (DC) voltage determined by currents flowing in the first resistor 221, the second resistor 222, and the sensing circuit 220.

Meanwhile, the diode 223 may be implemented as a transistor of which a base terminal and a collector terminal are connected to each other, and may also be implemented as a field effect transistor of which a gate terminal and a drain terminal are connected to each other. Thus, the diode 223 is not limited to a diode element formed by a single p-n junction.

A value of the current flowing in the sensing circuit 220 is adjusted depending on the resistance value of the first resistor 221 or the second resistor 222. A detailed description of the adjustment of the value of the current flowing in the sensing circuit 220 will be provided below with reference to FIG. 9.

Referring to FIG. 6, the biasing circuit 230 includes a first semiconductor switch 231, a second semiconductor switch 232, a first source circuit 236, and a second source circuit 237. The first semiconductor switch 231 is connected between the first source circuit 236 and a ground, and receives a current flowing into the ground from the first source circuit 236 at a base terminal and outputs the received current to an emitter terminal.

The second semiconductor switch 232 is connected between the second source circuit 237 and the ground, and receives a current flowing into the ground from the second source circuit 237 at a collector terminal and outputs the received current to an emitter terminal.

Here, a value of the current flowing in the base terminal of the second semiconductor switch 232 is determined based on a value of the current flowing in the collector terminal of the first semiconductor switch 231. Specifically, the current flowing in the collector terminal of the first semiconductor switch 231 and the current flowing in the base terminal of the second semiconductor switch 232 have a proportional relationship.

The first source circuit 236 generates a first reference current and provides the first reference current to the sensing circuit 220 and the ground. Here, as a value of a bias current sensed by the sensing circuit 220 is high, a value of a current flowing into the ground from the first source circuit 236 decreases.

The second source circuit 237 generates a second reference current and provides the second reference current to the sensing circuit 220 and the ground. As the value of the current flowing into the ground from the first source circuit 236 increases, the current flowing into the ground from the second source circuit 237 increases.

Specifically, the value of the current flowing into the ground from the first source circuit 236 and a base current of the first semiconductor switch 231 are proportional to each other. The base current of the first semiconductor switch 231 are proportional to a collector current of the first semiconductor switch 231. The collector current of the first semiconductor switch 231 and a base current of the second semiconductor switch 232 are proportional to each other. The base current of the second semiconductor switch 232 and a collector current of the second semiconductor switch 232 are proportional to each other.

Thus, as the current flowing into the ground from the first source circuit 236 increases, the current flowing into the ground from the second source circuit 237 increases. Increasing the current flowing into the ground from the source circuit means that a value obtained by dividing the reference current by the current provided to the sensing circuit 220 decreases. As a result, a current flowing into the second amplifier 212 is reduced, and an occurrence frequency of the over-current is reduced.

Figure 7:
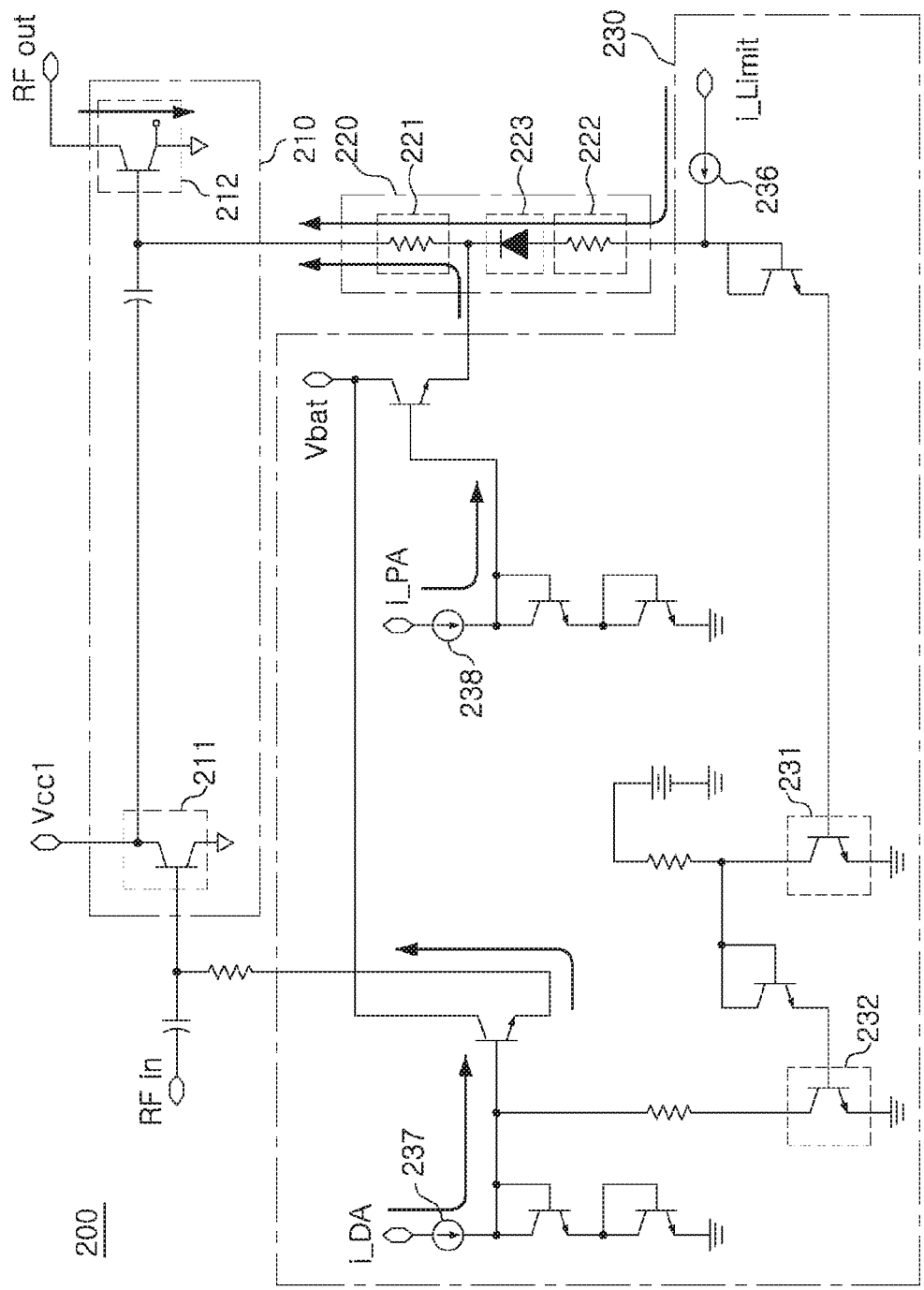
FIG. 7 is a diagram illustrating an operation of the power amplifier of FIG. 6, according to an embodiment.

FIG. 7 is a diagram illustrating an operation of the power amplifier of FIG. 6, according to an embodiment.

Referring to FIG. 7, a flow of a current in an overall circuit diagram of the power amplifier is illustrated in a circumstance in which the over-current does not flow in the second amplifier 212.

For example, when the over-current does not flow in the second amplifier 212, a voltage of a base terminal of the second amplifier 212 is 1.25V, and a threshold voltage of the diode 223 is 1.3V. As a result, the diode 223 is in an off-state.

A region in which a current of a relatively high value flows is indicated by an arrow. Hereinafter, a description will be provided on the basis of the arrow.

When the over-current does not flow in the second amplifier 212, a value of a bias current of the second amplifier 212 is relatively small, and a bias voltage of the base terminal of the second amplifier 212 is relatively high. In addition, a voltage dropped by the first resistor 221 and the second resistor 222 is low. In addition, since a voltage across the diode 223 is high, a current flowing in the diode 223 is high. That is, since the current flowing in the sensing circuit 220 is high, the majority of the current generated by the first source circuit 236 flows into the sensing circuit 220. In addition, the value of the current flowing into the first semiconductor switch 231 from the first source circuit 236 is low. In addition, the value of the current flowing into the second semiconductor switch 232 is low. In addition, the majority of the current generated by the second source circuit 237 flows into the first amplifier 211, not the second semiconductor switch 232.

Thus, the majority of the current generated by the first source circuit 236 flows into the second amplifier 212 and the majority of the current generated by the second source circuit 237 flows into the first amplifier 211.

An overall bias current of the second amplifier 212 is supplemented through an additional source circuit 238 as well as the first source circuit 236. For example, energy of an output signal of the second amplifier 212 is higher than the energy output of an output signal of the first amplifier 211. As a result, a value of the bias current of the second amplifier 212 is higher than a value of the bias current of the first amplifier 211. Thus, the second amplifier 212 is also supplied with the bias current through the additional source circuit 238. Here, the additional source circuit 238 may supply a current having a constant value, or a variable current according to an embodiment described above with reference to FIGS. 1 through 4.

Figure 8:
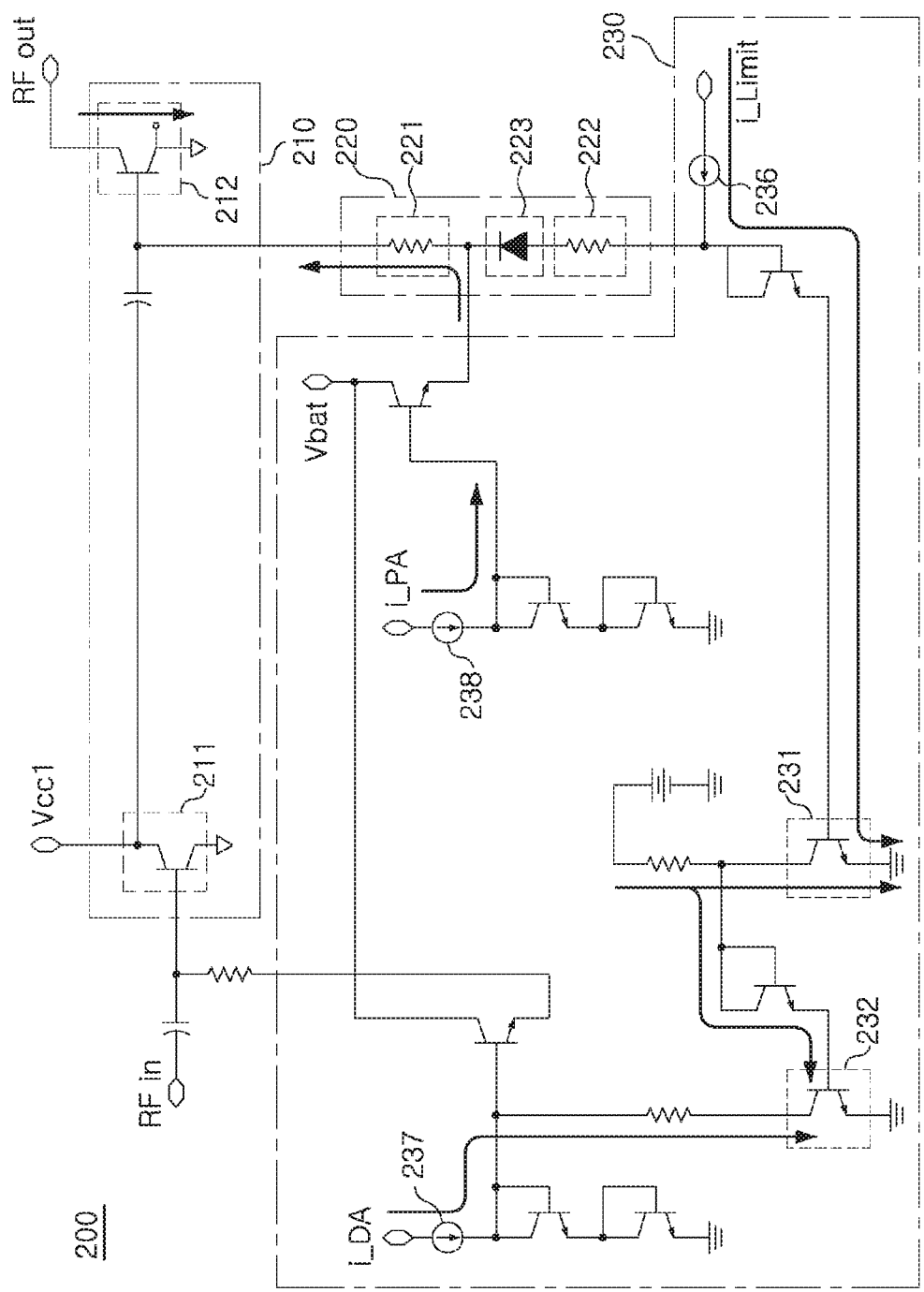
FIG. 8 is a diagram illustrating an operation of limiting a current in the power amplifier of FIG. 6, according to an embodiment.

FIG. 8 is a diagram illustrating an operation of limiting a current in the power amplifier 200 of FIG. 6, according to an embodiment. Referring to FIG. 8, a flow of a current in an overall circuit diagram of the power amplifier is illustrated in a circumstance in which the over-current flows in the second amplifier 212.

For example, when the over-current of 1.5 A or more flows in the second amplifier 212, a voltage of a base terminal of the second amplifier 212 decreases to 1V or less. As a result, the diode 223 is in an off-state. A region in which a current of a relatively high value flows is indicated by an arrow. Hereinafter, a description will be provided on the basis of the arrow.

When the over-current flows in the second amplifier 212, a value of a bias current of the second amplifier 212 is relatively high, and a bias voltage of the base terminal of the second amplifier 212 is relatively low. In addition, a voltage dropped by the first resistor 221 and the second resistor 222 is high. In addition, since a voltage across the diode 223 is low, a current flowing in the diode 223 may be low. That is, since the current flowing in the sensing circuit 220 is low, the majority of the current generated by the first source circuit 236 flows into the first semiconductor switch 231, not the sensing circuit 220. In addition, the value of the current flowing into the second semiconductor switch 232 is high. Further, the majority of the current generated by the second source circuit 237 flows into the second semiconductor switch 232, not the first amplifier 211.

Thus, the majority of the current generated by the first source circuit 236 flows into the ground, rather than the second amplifier 212. Here, in a case in which a value of a bias current of the first amplifier 211 decreases, a gain of the first amplifier 211 or energy of an output signal decreases. As a result, energy of a signal input to the second amplifier 212 decreases, and a value of a current flowing in an output terminal of the second amplifier 212 also decreases. As a result, the second amplifier 212 becomes a current limiter.

Figure 9:
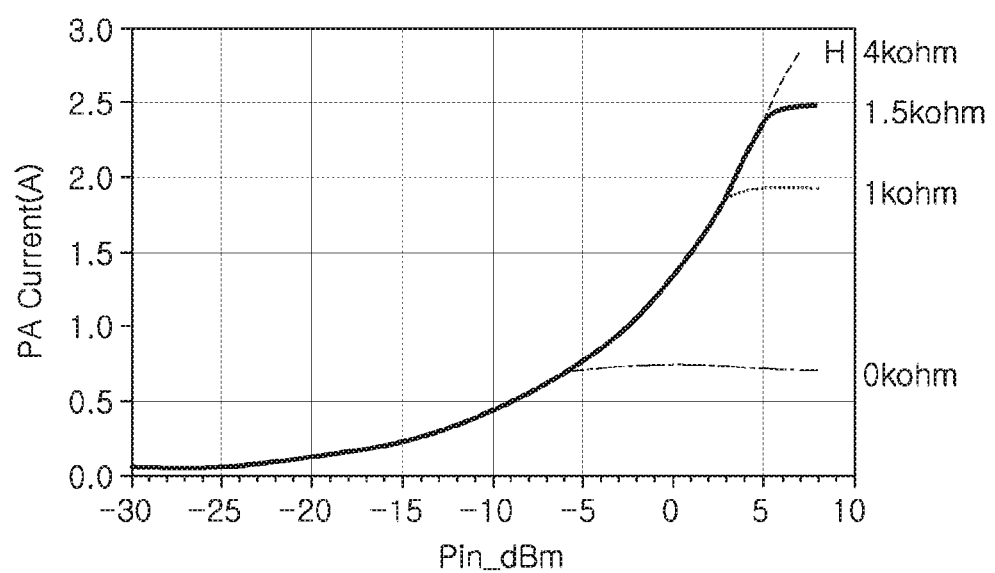
FIG. 9 is a graph illustrating a current flowing in an amplifier depending on a resistance value of a first resistor or a second resistor included in the power amplifier, according to an embodiment.

FIG. 9 is a graph illustrating a current flowing in an amplifier depending on a resistance value of a first resistor or a second resistor included in the power amplifier, according to an embodiment described herein.

Referring to FIG. 9, the horizontal axis denotes power of an input signal, and the vertical axis denotes a current flowing in the amplifier. At a load of the amplifier, a voltage standing wave ratio (VSWR) is assumed to be 10:1. Four curves illustrated in the graph illustrate a case in which the resistance value of the first resistor or the second resistor is very small (0ohm, 1 kohm, 1.5 kohm, and 4 kohm, respectively).

It can be confirmed from the graph that a maximum current flowing in the amplifier is varied depending on the resistance value of the first resistor or the second resistor. For example, in a case in which a design of the power amplifier having a maximum current of 2.5 A or less flowing in an output terminal is required, the power amplifier may be designed so that the resistance value of the first resistor or the second resistor (or a summation of the resistance value of the first resistor and the resistance value of the second resistor) is 1.5 kohm.

That is, the maximum current of the power amplifier may be precisely adjusted depending on the resistance value of the first resistor or the second resistor. As a result, the power amplifier according to an embodiment disclosed herein precisely controls the maximum current and is designed to be optimized for a maximum current standard or a communications standard of internal elements.

Hereinafter, a method for limiting a current in a power amplifier, according to an embodiment, will be described. Since the method for limiting the current is performed by the power amplifier 100 described above with reference to FIG. 1 or the power amplifier 200 described above with reference to FIG. 5, a description of features that are the same as or correspond to those described above will be omitted.

Figure 10:
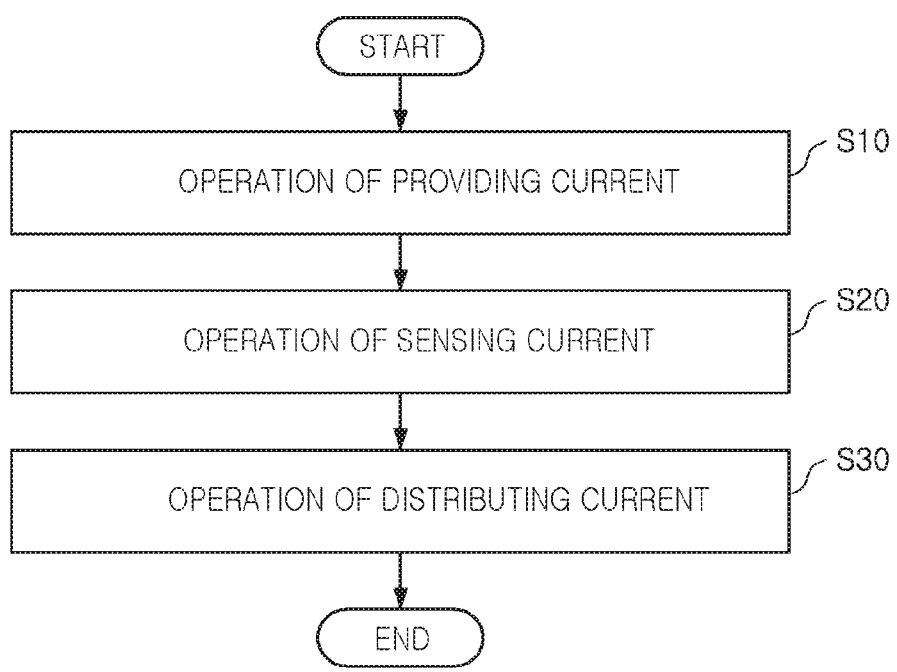
FIG. 10 is a flow chart illustrating a method for limiting a current in a power amplifier, according to an embodiment.

FIG. 10 is a flow chart illustrating a method for limiting a current in a power amplifier 100 or 200, according to an embodiment. Referring to FIG. 10, the method for limiting the current includes an operation of providing a current (S10), an operation of sensing the current (S20), and an operation of distributing the current (S30).

For example, the method for limiting the current may be autonomously performed by an internal control circuit of the power amplifier, or may be performed by an external control circuit.

In the operation of providing a current (S10), the power amplifier is provided with a current for operation of the power amplifier.

In the operation of sensing the current (S20), when the power amplifier is operated, the power amplifier senses a current flowing in the power amplifier.

In the operation of distributing the current (S30), in a case in which a value of the current flowing in the power amplifier is higher than a preset value, the power amplifier distributes the current so that a portion of the current provided to the power amplifier is dropped, using a sensing circuit sensing a bias of the power amplifier.

The preset value may be a maximum current standard of the power amplifier or an internal element of the power amplifier. For example, the preset value may be adjusted by adjusting the resistance value of the sensing circuit as described above with reference to FIG. 9. Further, the sink (dropping of the portion of the current provided to the power amplifier) means that the current leaks to other blocks, external elements, a ground, or the like, rather than the power amplifier.

According to the method for limiting the current, since the power amplifier reduces an occurrence frequency of an over-current, the possibility of damage to elements of the power amplifier is reduced.

Figure 11:
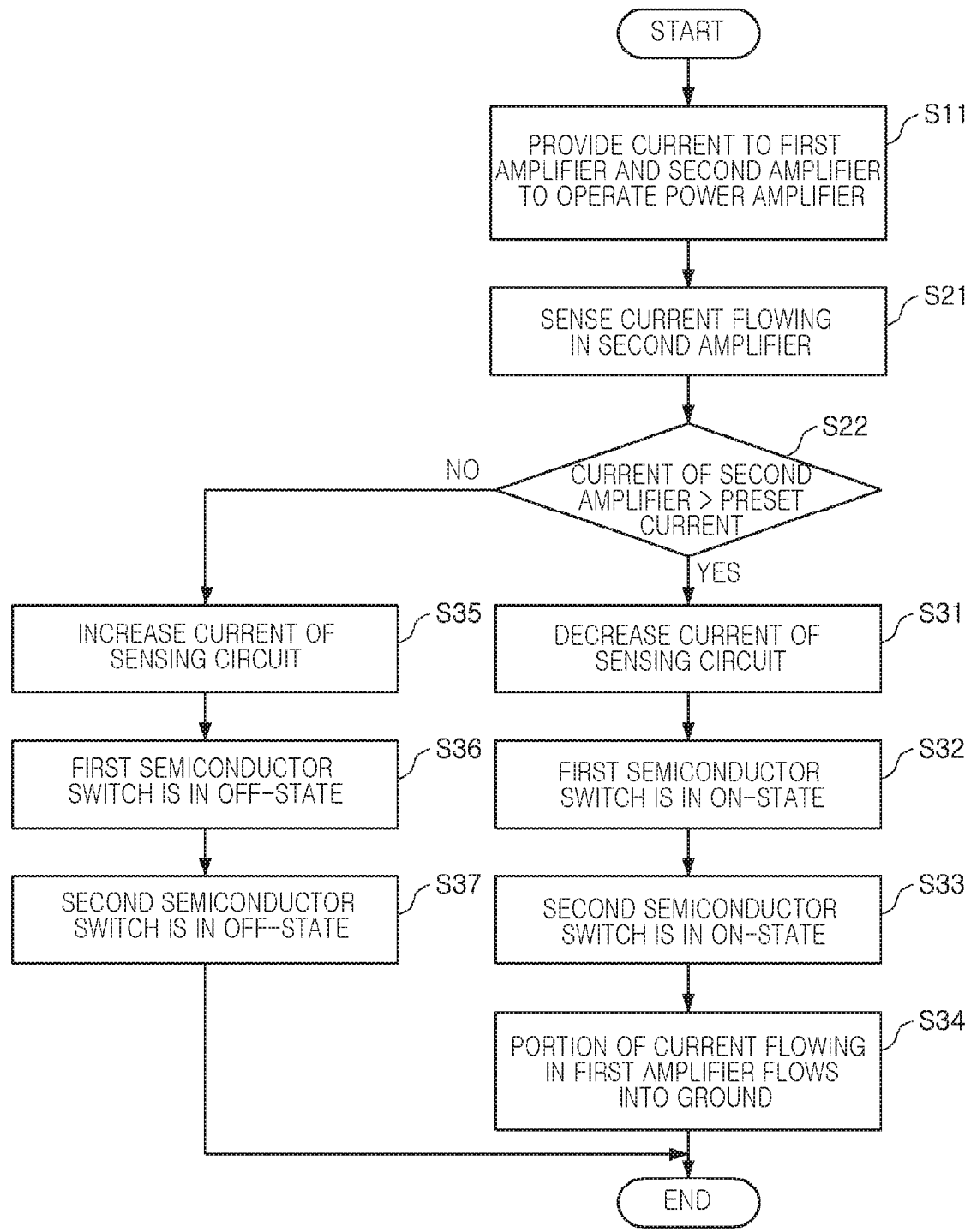
FIG. 11 is a flow chart illustrating the method for limiting a current of FIG. 10 in greater detail, according to an embodiment.

FIG. 11 is a flow chart illustrating the method for limiting the current of FIG. 10 in greater detail, according to an embodiment.

Referring to FIG. 11, a control circuit controlling the power amplifier provides the current to a first amplifier and a second amplifier to operate the power amplifier (operation S11) and senses a current flowing in the second amplifier (operation S21).

In a case in which the current flowing in the second amplifier is higher than a preset current (operation S22), a current flowing in the sensing circuit is decreased (operation S31), a first semiconductor switch is in an on-state (operation S32), a second semiconductor switch is in the on-state (operation S33), and a portion of a current flowing in the first amplifier flows into the ground (operation S34).

In a case in which the current flowing in the second amplifier is smaller than the preset current (operation S22), the current flowing in the sensing circuit is increased (operation S35), the first semiconductor switch is in an off-state (operation S36), and the second semiconductor switch is in the off-state (operation S37).

As set forth above, according to the embodiments disclosed herein, the power amplifier breaks the over-current of the allowable value or more so as not to flow the over-current in the power amplifier, thereby reducing possibility of damage to elements in the power amplifier.

Further, the power amplifier precisely controls the maximum current and is designed to be optimized for the maximum current standard or the communications standard of the internal elements of the power amplifier.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier apparatus, comprising:
an amplifier configured to amplify an input signal;
a sensing circuit connected to the amplifier and configured to sense a bias of a base terminal of the amplifier; and
a biasing circuit connected to the sensing circuit and configured to provide a biasing current to the amplifier, wherein the sensing circuit is configured to change the biasing current based on the bias of the amplifier.

2. The power amplifier apparatus of claim 1, wherein the amplifier comprises:
a first amplifying circuit configured to amplify the input signal; and
a second amplifying circuit configured to amplify the input signal amplified by the first amplifying circuit, and
the sensing circuit is connected to the second amplifying circuit.

3. A power amplifier apparatus, comprising:
an amplifier configured to amplify an input signal;
a sensing circuit connected to the amplifier and configured to sense a bias of the amplifier; and
a biasing circuit connected to the sensing circuit and configured to provide a biasing current to the amplifier, wherein the sensing circuit is configured to change the biasing current based on the bias of the amplifier, and
wherein the amplifier comprises at least one bipolar junction transistor (BJT) configured to amplify a signal input to a base terminal and output the amplified signal to a collector terminal, and
the sensing circuit is configured to sense a bias current of the base terminal of the bipolar junction transistor.

4. The power amplifier apparatus of claim 1, wherein the sensing circuit comprises:
a diode configured to pass a current based on the bias of the amplifier;
a first resistor connected between the amplifier and the diode; and
a second resistor connected between the diode and the biasing circuit.

5. The power amplifier apparatus of claim 1, wherein as a value of a bias current of the amplifier increases, the sensing circuit decreases a value of the biasing current.

6. The power amplifier apparatus of claim 1, wherein:
the biasing circuit comprises at least one source circuit configured to generate a reference current and provide the generated reference current to the sensing circuit and a ground; and
as a bias current of the amplifier increases, a value obtained by dividing the reference current by a current provided to the sensing circuit decreases.

7. The power amplifier apparatus of claim 6, wherein:
the source circuit comprises
a first source circuit configured to generate a first reference current, and
a second source circuit configured to generate a second reference current;
as a value of a bias current sensed by the sensing circuit increases, a value of a current flowing into the ground from the first source circuit increases; and
as the value of the current flowing into the ground from the first source circuit increases, a value of a current flowing into the ground from the second source circuit increases.

8. The power amplifier apparatus of claim 7, wherein:
the biasing circuit further comprises
a first semiconductor switch connected between the first source circuit and the ground, the first semiconductor switch being configured to receive the current flowing into the ground from the first source circuit at a first base terminal, and output the current flowing into the ground to a first emitter terminal, and
a second semiconductor switch connected between the second source circuit and the ground, the second semiconductor switch being configured to receive the current flowing into the ground from the second source circuit at a second collector terminal, and output the current flowing into the ground to a second emitter terminal; and a value of the current flowing in a second base terminal of the second semiconductor switch is determined based on a value of current flowing in a first collector terminal of the first semiconductor switch.

9. A power amplifier comprising:

a first amplifier configured to amplify an input signal;

a second amplifier connected to the first amplifier and configured to amplify the input signal amplified by the first amplifier;

a sensing circuit connected to the second amplifier and configured to sense a bias of a base terminal of the second amplifier; and a biasing circuit connected to the sensing circuit and the first amplifier and configured to provide a biasing current to the first amplifier, wherein the sensing circuit is configured to change the biasing current based on the bias of the second amplifier.

10. The power amplifier of claim 9, wherein:

the second amplifier comprises at least one bipolar junction transistor (BJT) configured to amplify a signal input to a base terminal and output the amplified signal to a collector terminal;

the sensing circuit is configured to sense a bias current of the base terminal of the bipolar junction transistor; and as a value of a bias current of the second amplifier increases, the biasing circuit decreases a value of the biasing current provided to the first amplifier.

11. The power amplifier of claim 9, wherein the sensing circuit comprises:

a diode configured to pass a current based on the bias of the second amplifier;

a first resistor connected between the second amplifier and the diode; and a second resistor connected between the diode and the biasing circuit.

12. The power amplifier of claim 9, wherein:

the biasing circuit comprises a first source circuit configured to generate a first reference current and provide the reference current to the sensing circuit and a ground, and a second source circuit configured to generate a second reference current and provide the second reference current to the first amplifier and the ground;

as a value of a bias current sensed by the sensing circuit increases, a value of a current flowing into the ground from the first source circuit increases; and as the value of the current flowing into the ground from the first source circuit increases, a value of a current flowing into the ground from the second source circuit increases.

13. The power amplifier of claim 12, wherein:

the biasing circuit further comprises a first semiconductor switch connected between the first source circuit and the ground, the first semiconductor switch being configured to receive the current flowing into the ground from the first source circuit at a first base terminal and output the current flowing into the ground to a first emitter terminal, and a second semiconductor switch connected between the second source circuit and the ground, the second semiconductor switch being configured to receive the current flowing into the ground from the second source circuit at a second collector terminal and output the current flowing into the ground to a second emitter terminal; and a value of a current flowing in a second base terminal of the second semiconductor switch is determined based on a value of a current flowing in a first collector terminal of the first semiconductor switch.

14. A method for limiting current in a power amplifier apparatus, comprising:

providing a biasing current to an amplifier;

sensing, at a sensing circuit connected to the amplifier, a bias of a base terminal of the amplifier; and changing the biasing current based on the bias of the amplifier, using the sensing circuit.

15. The method of claim 14, wherein the sensing circuit comprises:

a diode configured to pass a current based on the bias of the amplifier;

a first resistor connected between the amplifier and the diode; and a second resistor connected between the diode and a biasing circuit providing the biasing current to the amplifier.

16. The method of claim 14, further comprising decreasing a value of the biasing current in response to a value of a bias current of the amplifier increasing.

17. The method of claim 14, further comprising:

providing the biasing current to the amplifier by providing, using a biasing circuit, a reference current to the sensing circuit and a ground; and as a bias current of the amplifier increases, adjusting a current provided to the sensing circuit such that a value obtained by dividing the reference current by the current provided to the sensing circuit decreases.

18. The method of claim 17, further comprising, as a value of a bias current sensed by the sensing circuit increases, increasing an amount of current flowing into the ground from the biasing circuit.

* * * * *